(12) United States Patent
Macris

(10) Patent No.: US 10,283,974 B2
(45) Date of Patent: May 7, 2019

(54) SYSTEMS AND METHODS FOR INTELLIGENT, ADAPTIVE MANAGEMENT OF ENERGY STORAGE PACKS

(75) Inventor: Eric Macris, San Francisco, CA (US)

(73) Assignee: Volterra Semiconductor LLC, San Jose, CA (US)

( * ) Notice: Subject to any disclaimer, the term of this patent is extended or adjusted under 35 U.S.C. 154(b) by 713 days.

(21) Appl. No.: 13/308,330

(22) Filed: Nov. 30, 2011

(65) Prior Publication Data

US 2012/0119746 A1 May 17, 2012

Related U.S. Application Data

(63) Continuation-in-part of application No. 12/716,203, filed on Mar. 2, 2010.

(60) Provisional application No. 61/202,460, filed on Mar. 2, 2009.

(51) Int. Cl.
| | | |
|---|---|---|
| *H02J 7/00* | (2006.01) | |
| *B60L 11/18* | (2006.01) | |
| *G01R 31/3842* | (2019.01) | |
| *G01R 31/396* | (2019.01) | |
| *H02M 1/00* | (2006.01) | |

(52) U.S. Cl.
CPC ......... *H02J 7/0021* (2013.01); *B60L 11/1864* (2013.01); *G01R 31/3842* (2019.01); *G01R 31/396* (2019.01); *B60L 2240/547* (2013.01); *B60L 2240/549* (2013.01); *H02M 2001/0077* (2013.01); *Y02T 10/7011* (2013.01); *Y02T 10/7055* (2013.01); *Y02T 10/7061* (2013.01)

(58) Field of Classification Search
USPC .................................................. 320/152, 132
See application file for complete search history.

(56) References Cited

U.S. PATENT DOCUMENTS

| | | | | |
|---|---|---|---|---|
| 3,956,638 A | * | 5/1976 | Ahrens | ..................... G05F 1/59 307/44 |
| 4,263,644 A | | 4/1981 | Zellmer | |
| 4,307,441 A | | 12/1981 | Bello | |
| 4,369,489 A | | 1/1983 | Pruitt | |

(Continued)

FOREIGN PATENT DOCUMENTS

| | | | |
|---|---|---|---|
| JP | 11103538 | | 4/1999 |
| JP | H2005-033898 | | 2/2005 |
| WO | WO 01/69273 | * | 9/2001 |

OTHER PUBLICATIONS

International Search Report and Written Opinion for PCT/US2010/025978, dated Apr. 29, 2010 (8 pages).

(Continued)

*Primary Examiner* — Samuel Berhanu
(74) *Attorney, Agent, or Firm* — Lathrop Gage LLP

(57) ABSTRACT

Systems and methods for intelligent, adaptive management of energy storage packs are disclosed. A method comprises receiving a first current measurement of a first energy storage cell electrically connected to a first converter circuit. The first converter circuit controls the charge and discharge of the first energy storage cell. A first voltage measurement of the first energy storage cell is received. A first temperature measurement of the first energy storage cell is received. The first current measurement, the first voltage measurement, and the first temperature measurement are translated into a state of charge of the first energy storage cell.

21 Claims, 5 Drawing Sheets

(56) References Cited

U.S. PATENT DOCUMENTS

| | | | |
|---|---|---|---|
| 4,504,896 A | 3/1985 | Aires et al. | |
| 4,504,898 A | 3/1985 | Pilukaitis et al. | |
| 4,654,769 A | 3/1987 | Middlebrook | |
| 4,709,316 A | 11/1987 | Ngo et al. | |
| 4,916,379 A | 4/1990 | Gaubis et al. | |
| 5,068,575 A | 11/1991 | Dunsmore et al. | |
| 5,101,335 A | 3/1992 | Dunsmore et al. | |
| 5,204,809 A | 4/1993 | Andresen | |
| 5,521,807 A | 5/1996 | Chen et al. | |
| 5,663,874 A | 9/1997 | Mader et al. | |
| 5,694,030 A | 12/1997 | Hasegawa et al. | |
| 5,701,068 A | 12/1997 | Baer et al. | |
| 5,710,504 A | 1/1998 | Pascual et al. | |
| 5,745,352 A | 4/1998 | Borghi et al. | |
| 5,764,027 A * | 6/1998 | Harvey | 320/125 |
| 5,781,419 A | 7/1998 | Divan et al. | |
| 5,808,455 A | 9/1998 | Ren et al. | |
| 5,917,313 A | 6/1999 | Callahan, Jr. | |
| 5,939,866 A | 8/1999 | Bjorkengren | |
| 5,945,808 A | 8/1999 | Kikuchi | |
| 5,991,171 A | 11/1999 | Cheng | |
| 5,998,967 A | 12/1999 | Umeki et al. | |
| 6,043,629 A * | 3/2000 | Ashley et al. | 320/119 |
| 6,058,030 A | 5/2000 | Hawkes et al. | |
| 6,121,751 A | 9/2000 | Merritt | |
| 6,137,274 A | 10/2000 | Rajagopalan | |
| 6,140,808 A | 10/2000 | Massie | |
| 6,141,224 A | 10/2000 | Ma et al. | |
| 6,150,795 A | 11/2000 | Kutkut et al. | |
| 6,225,794 B1 | 5/2001 | Criscione et al. | |
| 6,278,621 B1 | 8/2001 | Xia et al. | |
| 6,285,175 B1 | 9/2001 | Massie | |
| 6,369,546 B1 | 4/2002 | Canter | |
| 6,417,653 B1 | 7/2002 | Massie et al. | |
| 6,420,858 B1 | 7/2002 | Kitagawa et al. | |
| 6,424,119 B1 | 7/2002 | Nelson et al. | |
| 6,437,539 B2 | 8/2002 | Olsson et al. | |
| 6,462,962 B1 | 10/2002 | Cuk | |
| 6,465,986 B1 | 10/2002 | Haba | |
| 6,510,065 B1 | 1/2003 | Massie et al. | |
| 6,538,414 B1 | 3/2003 | Tsuruga et al. | |
| 6,583,603 B1 | 6/2003 | Baldwin | |
| 6,628,533 B2 | 9/2003 | Dinh | |
| 6,696,825 B2 | 2/2004 | Harris et al. | |
| 6,704,211 B1 | 3/2004 | Vogman | |
| 6,771,045 B1 | 8/2004 | Keller | |
| 6,801,014 B1 | 10/2004 | Chitsazan et al. | |
| 6,842,350 B2 | 1/2005 | Simada et al. | |
| 6,873,134 B2 | 3/2005 | Canter et al. | |
| 6,903,537 B2 | 6/2005 | Chen et al. | |
| 6,924,622 B1 | 8/2005 | Anbuky et al. | |
| 7,002,817 B2 | 2/2006 | Lipcsei | |
| 7,049,791 B2 | 5/2006 | Lin et al. | |
| 7,109,685 B2 * | 9/2006 | Tate et al. | 320/132 |
| 7,135,836 B2 | 11/2006 | Kutkut et al. | |
| 7,135,837 B2 | 11/2006 | Patino | |
| 7,157,882 B2 * | 1/2007 | Johnson et al. | 320/134 |
| 7,193,392 B2 | 3/2007 | King et al. | |
| 7,196,494 B2 | 3/2007 | Baumgartner | |
| 7,233,133 B2 | 6/2007 | Chen et al. | |
| 7,233,134 B2 | 6/2007 | Huang et al. | |
| 7,375,503 B2 | 5/2008 | Bo | |
| 7,459,882 B2 | 12/2008 | Morgan | |
| 7,459,894 B2 | 12/2008 | Li et al. | |
| 7,463,958 B2 * | 12/2008 | Suzuki | 701/22 |
| 7,471,065 B2 | 12/2008 | Emori et al. | |
| 7,492,124 B2 | 2/2009 | Johnson et al. | |
| 8,686,693 B2 | 4/2014 | Bhowmik et al. | |
| 2002/0000790 A1 | 1/2002 | Sano et al. | |
| 2002/0041168 A1 * | 4/2002 | Mann et al. | 318/254 |
| 2003/0107352 A1 | 6/2003 | Downer et al. | |
| 2004/0189257 A1 * | 9/2004 | Dougherty et al. | 320/132 |
| 2005/0052158 A1 * | 3/2005 | Meissner | 320/132 |
| 2005/0099159 A1 * | 5/2005 | Ishida | 320/128 |
| 2006/0139007 A1 * | 6/2006 | Kim | 320/134 |
| 2006/0238165 A1 * | 10/2006 | Moore | H02J 7/0016 320/118 |
| 2007/0103121 A1 | 5/2007 | Johnson et al. | |
| 2007/0236181 A1 * | 10/2007 | Palladino | 320/130 |
| 2007/0247115 A1 | 10/2007 | Ishikawa et al. | |
| 2008/0094030 A1 * | 4/2008 | Lundy | 320/126 |
| 2008/0231115 A1 | 9/2008 | Cho et al. | |
| 2008/0284378 A1 * | 11/2008 | Birke et al. | 320/149 |
| 2008/0315839 A1 * | 12/2008 | Hermann | 320/136 |
| 2009/0168463 A1 | 7/2009 | Zhao et al. | |
| 2009/0208821 A1 | 8/2009 | Kosugi et al. | |
| 2009/0261658 A1 * | 10/2009 | Kato | B60K 6/445 307/82 |
| 2009/0289599 A1 * | 11/2009 | White et al. | 320/120 |
| 2009/0295348 A1 | 12/2009 | Tao et al. | |
| 2009/0295349 A1 | 12/2009 | Tao et al. | |
| 2009/0295350 A1 | 12/2009 | Yamada | |
| 2009/0295351 A1 | 12/2009 | Kudo et al. | |
| 2010/0090649 A1 * | 4/2010 | Sardat et al. | 320/118 |
| 2010/0207587 A1 | 8/2010 | Oyobe et al. | |
| 2010/0225277 A1 | 9/2010 | Ochi et al. | |
| 2010/0305770 A1 * | 12/2010 | Bhowmik et al. | 700/295 |
| 2011/0101920 A1 * | 5/2011 | Seo | B60L 11/1861 320/127 |

OTHER PUBLICATIONS

Lee et al., "Intelligent Control Battery Equalization for Series Connected Lithium-Ion Battery Strings," IEEE Transactions on Industrial Electronics, vol. 52, No. 5, Oct. 2005, pp. 1297-1307 (11 pages).

Application No. PCT/US12/067056, International Search Report and Written Opinion, dated Feb. 15, 2013, 7 pages.

Walker et al., "Cascaded DC-DC Converter Connection of Photovoltaic Modules," IEEE Trans. Power Electronics, vol. 19, No. 4, Jul. 2004, pp. 1130-1139.

Wolfs et al., "Distributed Maximum Power Tracking for High Performance Vehicle Solar Arrays," AUPEC 2004, Sep. 26-29, 2004, 6 pages.

* cited by examiner

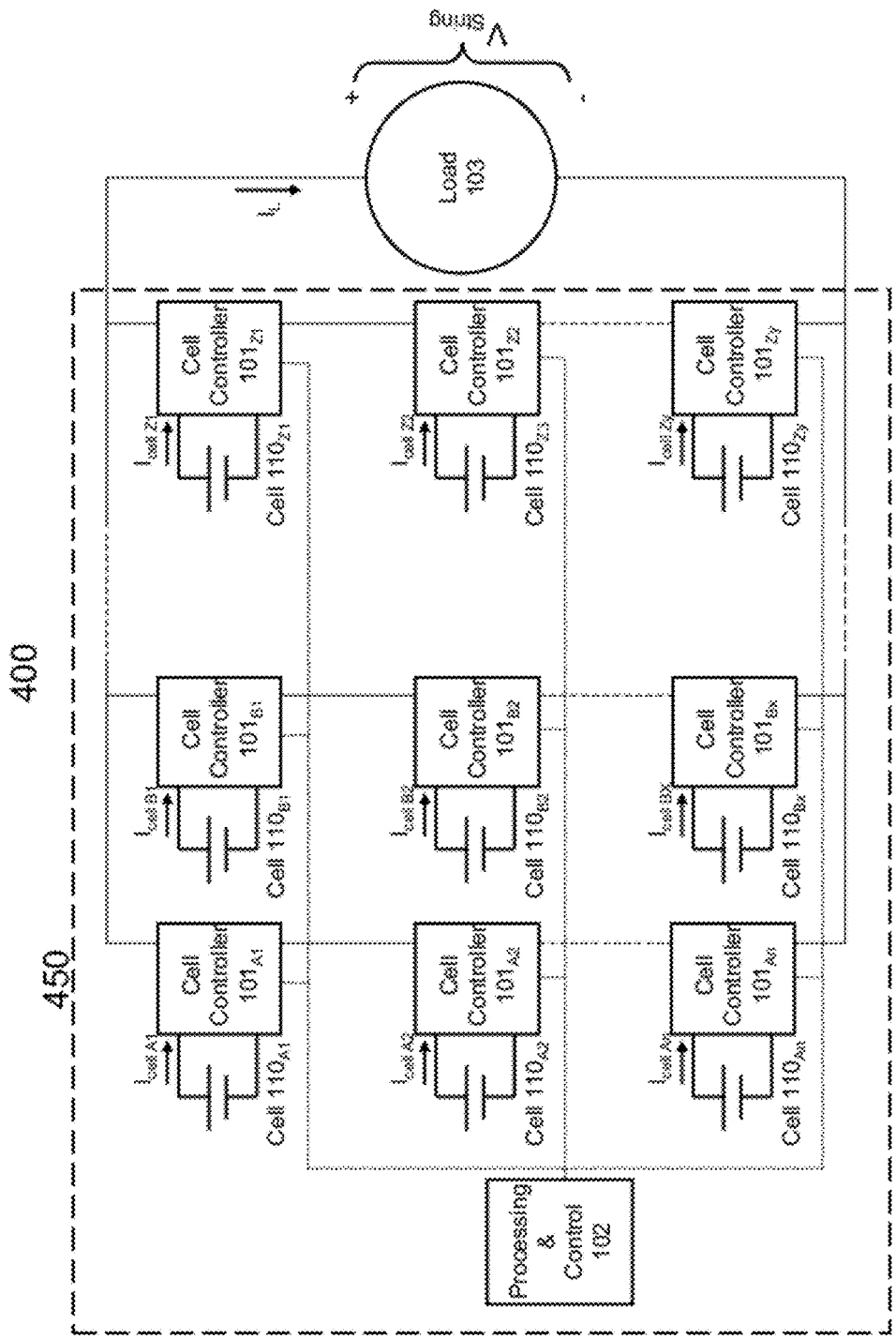

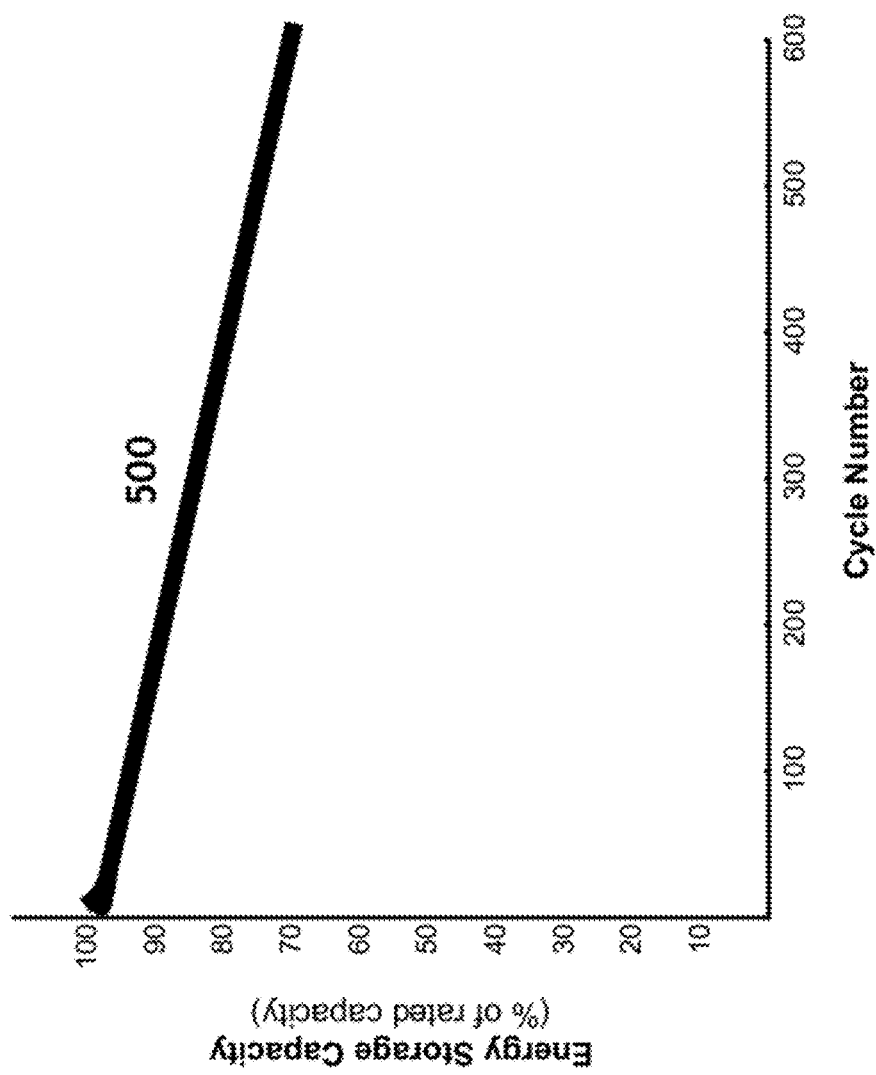

SYSTEMS AND METHODS FOR INTELLIGENT, ADAPTIVE MANAGEMENT OF ENERGY STORAGE PACKS

CROSS-REFERENCE TO RELATED APPLICATIONS

The present application is a continuation-in-part of and claims the benefit of and priority to U.S. patent application Ser. No. 12/716,203 entitled "SYSTEMS AND METHODS FOR SCALABLE CONFIGURATIONS OF INTELLIGENT ENERGY STORAGE PACKS" filed on Mar. 2, 2010, and is hereby incorporated by reference; that claims priority to U.S. Provisional Patent Application No. 61/202,460 entitled "SYSTEMS AND METHODS FOR SCALABLE CONFIGURATIONS OF INTELLIGENT ENERGY STORAGE PACKS" filed on Mar. 2, 2009, and is hereby incorporated by reference.

FIELD

The field of the invention relates generally to energy storage based power systems. In particular, the present invention is direct to systems and methods for intelligent, adaptive management of energy storage packs.

BACKGROUND

Battery packs, or arrangements of multiple energy storage cells coupled together, are used as power sources in a host of devices. The devices can include all-electric vehicles, hybrid electric vehicles, portable electronic devices, military applications, medical devices, back-up power and distributed energy storage systems in residential and business locations. Improvements in underlying electrochemistry have yielded batteries with improved performance characteristics, such as the Li-ion battery. However, even where multiple energy storage cells are intended to be the same in structure and performance characteristics, there are differences among individual cells. Even with state-of-the-art manufacturing, cells are inherently dissimilar and demonstrate variations in capacity, lifetime, rates of charge/discharge, and other inter-related properties. For example, a battery pack containing a collection of individual cells may exhibit cell-to-cell differences in energy storage capacity of 2-3% when new, and this variation may increase over time (i.e., as the battery pack ages and is charged and discharged multiple times). Since the individual cells of a conventional battery pack may be electrically connected in series to form a series string, the overall performance of the battery pack can be degraded by the performance of the weakest cell in the string. For example, with conventional pack architectures, in a series string of cells, the first cell to become discharged during use may limit the discharge of the other cells in a less than optimum manner.

Conventional approaches have attempted to address the aforementioned problems and improve the performance of battery packs by providing charge balancing, e.g., electronic circuitry intended to equalize cell voltages or states of charge. Such charge-balancing systems include electrical switches and other electrical elements (resistors, capacitors, inductors) present at each cell, or grouping of cells, of the battery pack. In some such systems, resistors may be intermittently connected in parallel with battery cells in a coordinated manner to equalize cell charging voltages by shunting excess current. In other systems, capacitors or inductors are intermittently connected in parallel with cells, such that charge can be transferred from relatively-high-voltage cells to relatively-low-voltage cells. In this manner, performance variations among cells are partially managed, such that the cells of the battery pack converge toward a desired voltage or state of charge.

Conventional switched-resistor, switched-capacitor, and switched-inductor battery management system architectures provide only partial solutions to the problem of performance variation among cells in multi-cell packs. These battery management systems have only a limited ability to accommodate variations in cell capacity, lifetime, maximum rates of charge/discharge, and other properties of multi-cell packs. Moreover, conventional battery management systems, while compensating for usage performance, may actually reduce the usable lifetimes of cells in a battery pack. As a result, in conventional battery packs, useful lifetime is diminished, typically limited by the weakest cells in the pack.

SUMMARY

Systems and methods for intelligent, adaptive management of energy storage packs are disclosed. A method comprises receiving a first current measurement of a first energy storage cell electrically connected to a first converter circuit. The first converter circuit controls the charge and discharge of the first energy storage cell. A first voltage measurement of the first energy storage cell is received. A first temperature measurement of the first energy storage cell is received. The first current measurement, the first voltage measurement, and the first temperature measurement are translated into a state of charge of the first energy storage cell.

The above and other preferred features, including various novel details of implementation and combination of elements, will now be more particularly described with reference to the accompanying figures. The particular systems, methods, and circuits described herein are shown for illustration only and not as limitations. As will be understood by those skilled in the art, the principles and features described herein may be employed in various and numerous embodiments without departing from the scope of the invention.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles of the present invention.

FIG. 4 illustrates an exemplary block diagram of a multi-cell energy storage system with multiple series strings of cell control circuits placed in parallel, according to one embodiment.

FIG. 5 illustrates a target capacity fade versus cycle number performance function of an energy storage cell, according to one embodiment.

DETAILED DESCRIPTION

Figure 1:
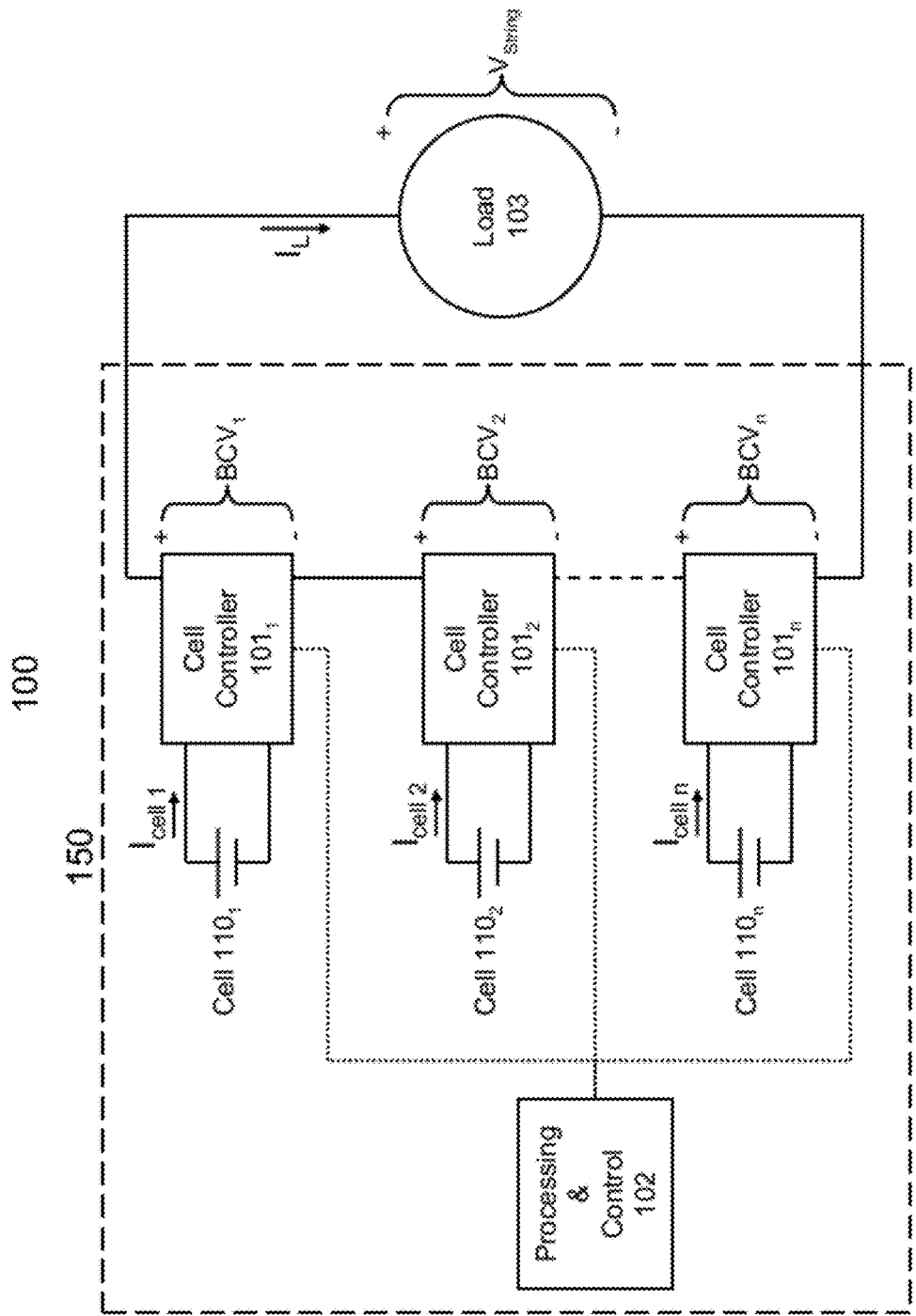
FIG. 1 illustrates an exemplary block diagram of a multi-cell energy storage system, including energy storage cells, exemplary cell control circuits, and a processing and control module, according to one embodiment.

Systems and methods for intelligent, adaptive management of energy storage packs are disclosed. A method comprises receiving a first current measurement of a first energy storage cell electrically connected to a first converter circuit. The first converter circuit controls the charge and discharge of the first energy storage cell. A first voltage measurement of the first energy storage cell is received. A first temperature measurement of the first energy storage cell is received. The first current measurement, the first voltage measurement, and the first temperature measurement are translated into a state of charge of the first energy storage cell.

The present disclosure describes control of an energy storage device that includes multiple energy storage cells. The present disclosure describes the associated electronic circuitry enabling load and charge currents and voltages for each cell in the system to be controlled independently from the aggregate currents and voltages placed on the system by an external load or charging device. Such a system can optimize continuously the load and charge on each energy storage cell according to each cell's unique and evolving performance characteristics. By optimizing the load and charge for each cell, overall system performance is enhanced significantly. Such a system can also maintain a fixed, regulated aggregate voltage output. The present disclosure focuses on the systems and methods for such intelligent management.

In the following description, for purposes of explanation, specific nomenclature is set forth to provide a thorough understanding of the various inventive concepts disclosed herein. However, it will be apparent to one skilled in the art that these specific details are not required to practice the various inventive concepts disclosed herein.

The present invention also relates to an apparatus for performing the operations herein. This apparatus may be specifically constructed for the required purposes, or it may comprise a general-purpose apparatus configured and controlled by a computer program stored in a computer. Such a computer program may be stored in a computer-readable storage medium, such as, but not limited to: floppy disk drives, optical disks, CD-ROMs, and magnetic-optical disks, read-only memories (ROMs), random access memories (RAMs), EPROMs, EEPROMs, magnetic or optical cards, or any other type of medium suitable for storing electronic instructions and coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will be apparent from the description below.

The present system and method address performance variations associated with individual energy storage devices (referred to generally herein as "cells") in multi-cell energy storage packs. Exemplary energy storage devices as referred to herein include, for example, electrochemical cells, super capacitors, magnetic energy storage devices, flywheels and associated electrical conversion circuitry, and other electrical energy storage devices.

FIG. 1 shows a simplified, exemplary embodiment of an energy storage system that includes a plurality of energy storage cells. Each energy storage cell 110 is connected to a cell controller module 101. Each cell controller 101 electrically buffers its associated cell 110 from the rest of the system 100, such that the current, voltage, and other parameters of one cell 110 can be managed independently of the other cells 110 in the system 100. In addition to being connected to an energy storage cell 110, each cell controller 101 is also connected to the rest of the system 100. As shown in the embodiment depicted in FIG. 1, the bus-side connections to the cell controllers 101 can be configured in a series string. The exemplary cell controller 101 possesses the functionality and ability to transform the voltage from the cell 110 to a desired voltage (e.g. $BCV_1$) on the bus side, and/or to transform the cell current $I_{cell}$ to a desired bus-side current $I_L$.

The exemplary cell controller 101 transforms its bus-side voltage to a desired voltage across the cell 110, and/or transforms the bus-side current $I_L$ to a desired cell current $I_{cell}$. The sum of the bus-side voltages of all the cell controllers 101 equals the total string voltage (e.g. $BCV_1 + BCV_2 + \ldots BCV_n = V_{String}$).

In one embodiment, each cell controller 101 measures the current, voltage, and temperature of cell 110, and also measures the bus-side voltage of cell controller 101.

System 100 includes a load 103 that acts either as an energy source or sink for the energy storage system 150. System 100 includes a processing and control module 102 that assesses the power requirements governed by load 103, collects and stores measurement data from cell controllers 101, and coordinates the performance of the cell controllers 101 to meet the power requirements of load 103.

A cell controller 101 can also be applied to buffer groups of cells, rather than individual cells. In other words, multiple cells can be grouped in combinations of series and/or parallel, with that group being managed fully and independently from other cells and/or cell groups.

In one embodiment, the series string of cell controllers 101 includes energy storage cells of heterogeneous type and performance characteristics. In other words, each energy storage cell in the series string could be of differing electrochemistry, voltage characteristics, and/or energy storage capacity.

Each cell or group of cells of the energy storage block 150 can be fully and independently managed with respect to charge and discharge demand placed on each cell or group of cells, while satisfying the power requirements of the load 103.

In one embodiment, each cell controller 101 is also capable of bypassing the associated energy storage cell or group of cells 110, such that the series string configuration is maintained on the bus side of the cell controller, but the associated cell or group of cells 110 is neither charged nor discharged during system operation.

The energy storage block 150 depicted in FIG. 1 enables buffered cells 110 to be placed in series strings without compromising individual cell performance. High-voltage, long series strings are desirable for most high-power applications, such as with automotive and grid-interactive solutions. Shorter series strings are desirable in many other, lower-power applications such as mobile electronics devices (e.g. laptop computers). In all such series strings, the apparatus depicted in FIG. 1 enables power flow in and out of each cell 110 to be optimized based on the cell's ability to deliver and store charge.

By optimizing the load and charge on each cell, the present system and method enable a combination of improvements, including extension of pack lifetime, and reduced pack size using fewer cells to reach targeted performance levels. The present system and method also have a high tolerance for variability among storage cells, thus enabling the use of less expensive cells manufactured to less stringent tolerances than the cells necessary in a conventional pack. Similarly, this high tolerance for variability enables the use of a higher percentage of cells manufactured (e.g. outlier performers can still be used instead of discarded). The present system and method also enable the use of heterogeneous collections of energy storage cells, in which cells may be of differing electrochemistry, energy storage capacity, or other performance characteristics. The present system and method also enable improved safety and reliability through cell-level monitoring, fault detection, and electrical isolation of faulty cells.

The present system and method also enable long series strings of buffered cells to provide a regulated, fixed output voltage—a desirable capability that contrasts with conventional energy storage packs, in which output voltage typically varies with the demands of the load and depends on the state of charge of the energy storage cells. This capability can reduce or eliminate the need for external voltage management systems.

The present system and method can be implemented either with a centralized supervisory controller or with the function of the supervisory controller implemented in a distributed processing system. According to one embodiment, such a distributed processing system is embedded as software in the control circuits of the cell controllers 101 of an energy storage pack that includes multiple cell controllers 101. For example, in one embodiment, such a distributed processing system includes software distributed across multiple Texas Instruments TMS 320F28035 Piccolo microcontrollers, with each such microcontroller controlling four cell controllers 101.

Figure 2:
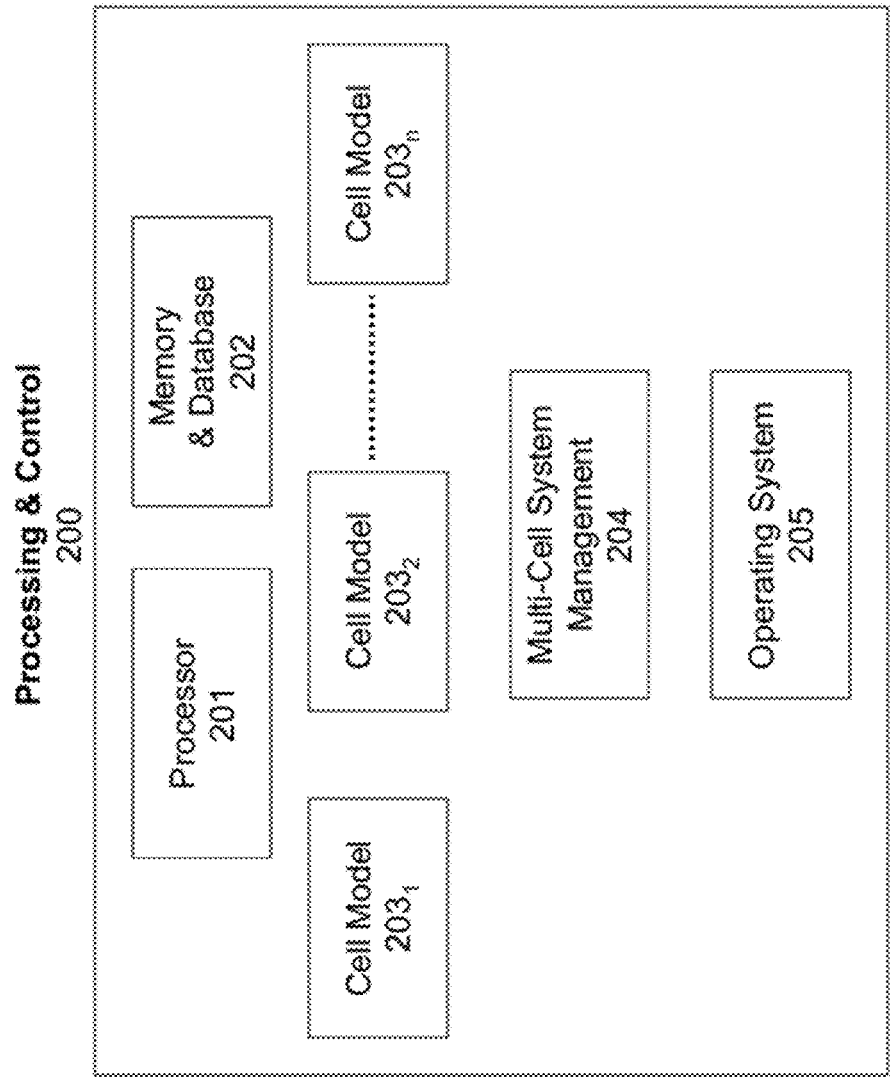
FIG. 2 illustrates an exemplary, block diagram of a processing and control module, according to one embodiment.

FIG. 2 illustrates an exemplary block diagram of a processing and control module, according to one embodiment. The processing and control module 200 includes a processor 201 that conducts and coordinates activities and communications among the other functional modules within processing and control module 200. Processor 201 also performs communications tasks with devices and systems external to the system disclosed herein.

In one embodiment, memory and database module 202 stores data lookup tables and measured data (such as voltage, current, and temperature measurements of energy storage cells) collected by the disclosed system. Such data lookup tables could include, for example, data characterizing the performance of an average, benchmark energy storage cell. Alternatively, a representation of the performance of such a benchmark energy storage cell could be stored as a collection of interrelated polynomial equations in memory and database module 202.

In one embodiment, the cell model module(s) 203 include algorithms to manage the charge and discharge of energy storage cells, with each cell model module 203 responsible for one cell or group of cells. These algorithms correlate measured performance of energy storage cells 101 to the corresponding performance predicted for an average, benchmark energy storage cell. In comparing actual and benchmark cell performance, these algorithms can predict energy storage capacity, state of charge, decay rate, and lifetime of each energy storage cell in the system. Cell model module(s) 203 also apply this comparison of actual vs. benchmark cell performance to update and refine the predictive model of each energy storage cell in the system.

Exemplary charge and discharge algorithms involve, for example, accessing look-up tables previously populated with cell operation information and decision making to correlate the looked-up information with charge or discharge conditions presently required by load 103. Exemplary decision-making algorithms are based upon, for example, trial-and-error testing of cell operation under different charging and discharging conditions as a function of time over the lifetime of test cells. In other words, under controlled conditions of trial-and-error testing, the impact on cell operation of changing voltage and/or current characteristics of that type of cell, depending upon its present state, is tabulated. Algorithms are then coded to change the voltage and/or current characteristics of such a cell, via cell controller 101, to achieve the performance desired. For example, if a cell model module 203 determines that the present discharge rate of its associated energy storage cell suggests that the cell's lifetime will be two months too short, an algorithm looks up in a look-up table the appropriate correction to be applied to cell controller 101 of that cell based upon the calculated lifetime shortfall and the present current and voltage operating characteristics of the cell.

The cell model modules 203 also may include detection algorithms, such as for monitoring cell temperature and determining whether the temperature exceeds a pre-defined safety threshold, and system instructions regarding cell safety and reliability, for example algorithms to predict and prevent potential cell thermal runaway events.

The cell model modules 203 could consist of multiple sub-modules to coordinate specific tasks, such as estimating the state of charge and/or internal impedance of energy storage cells, and/or relating cell temperature to cell aging and remaining lifetime. For example, in one embodiment, to correlate actual versus predicted cell performance, one such sub-module estimates the remaining energy stored in a cell (i.e. state of charge) by comparing the cell's measured energy storage capacity, the energy accumulated in the cell during the most recent charge cycle, and the energy delivered by the cell during the most recent discharge cycle. Similarly, in one embodiment, another such sub-module estimates cell internal impedance to refine the state-of-charge estimate. In one embodiment, another sub-module correlates cell temperature with the load and charge placed on a cell such that a uniform temperature is maintained across all cells in the energy storage pack.

The multi-cell system management module 204 includes algorithms and processes for interpreting electrical loading and charging placed on the system, for example the load and charge placed on a battery pack within an electric vehicle. The multi-cell system management module 204 also includes algorithms and processes for determining the appropriate distribution of the load and charge across the multiple energy storage cells in the system. In one embodiment, module 204 can make such determinations by comparing the relative energy storage capacities of each cell in the system, as reported by the cell model modules 203. Cells with relatively high capacities receive a relatively strong load or charge, while cells with relatively low capacities receive a relatively low load or charge.

Processing and control system 200 also includes an operating system 205 that controls basic operations of the energy storage packs. The basic operations include measuring and collecting system data, such as voltage, current, and temperature data from energy storage cells. These operations also include applying control settings to the cell controller nodes 101.

Figure 3:
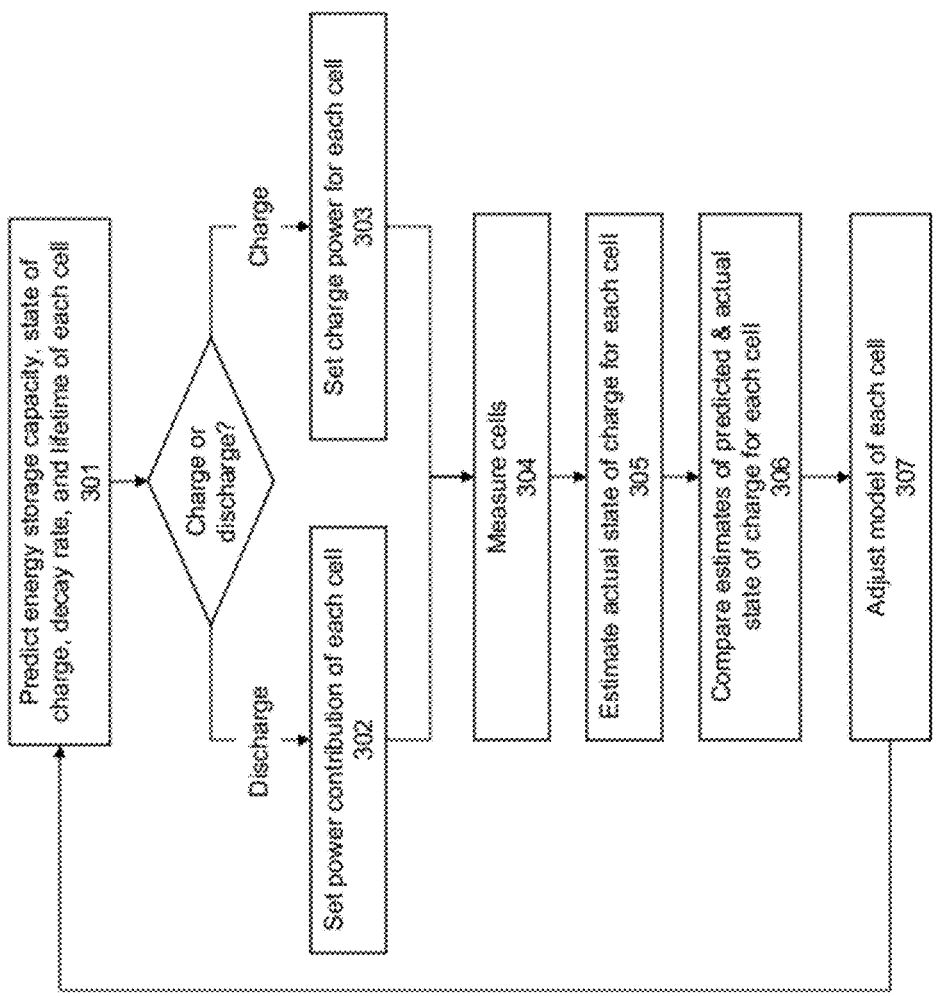
FIG. 3 illustrates a flow diagram of an exemplary process to control an energy storage pack, according to one embodiment.

FIG. 3 illustrates a flow diagram of an exemplary process to control an energy storage pack, according to one embodiment. When the system is initialized to begin either charging or discharging the energy storage pack, processor 201 invokes memory and database module 202, cell model modules 203, and multi-cell system management module 204 to predict or estimate the present energy storage capacity, state of charge, decay rate, and remaining lifetime of each energy storage cell in the system (301). For example the process may estimate each energy storage cell's maximum energy storage capacity in kilowatt-hours, the energy in kilowatt-hours actually stored in each cell at present, the C-rate at which each cell is presently being charged or discharged, and the number of charge-discharge cycles each cell could sustain at the presently predicted rate and depth of charge-discharge. Processor 201 then determines whether load 103 requires the energy storage system to be charged or discharge.

During discharge, processor 201 invokes multi-cell system management module 204 to determine the optimal power contribution of each energy storage cell 110. In one embodiment, processor 201 sets the power contribution of each energy storage cell 101 by instructing operating system 205 to set the bus-side (output) voltage of each cell controller module 101 (302). In setting the bus-side voltages, multi-cell system management module 204, in conjunction with the cell model modules 203, works to ensure that the load placed on each energy storage cell is consistent with a target system management goal. A target system management goal could be, for example, to cause the energy storage cells in the system to decay at the same predetermined rate, such that all cells in the system will reach the end of their usable lives at the same time.

In one embodiment, each cell controller 101 operates to achieve an optimal number of lifetime cycles of operation for a given energy storage cell 110, depending on that cell's measured storage capacity. For example, each cell controller 101 can be operated so that each cell 110 will follow as closely as possible a target slope (e.g., desired behavior) of capacity fade versus number of cycles for a given load, and may be based upon performance testing of actual cells or simulated predictions, such as depicted by the exemplary line 500 in FIG. 5.

Alternatively, another exemplary target system management goal could be to maximize the lifetime energy contribution of each cell in the system—a goal that does not necessarily imply that the cells decay at the same rate.

In one embodiment, the multi-cell system management controller module 204 also sets the bus-side voltages such that the aggregate bus-side voltage of the series string of cell controllers 101 is fixed.

During charge, processor 201 invokes multi-cell system management module 204 to determine the optimal power absorption of each energy storage cell. In one embodiment, processor 201 sets the power absorption of each energy storage cell by instructing operating system 205 to set the charge current level of each cell controller module 101 (303). In setting the charge current levels, multi-cell system management module 204, in conjunction with the cell model modules 203, works to ensure that the charge placed on each energy storage cell is consistent with a target system management goal. A target system management goal could be, for example, to cause the energy storage cells in the system to decay at the same predetermined rate, such that all cells in the system will reach the end of their usable lives at the same time. In one embodiment, each cell controller 101 operates to achieve an optimal number of lifetime cycles of operation for a given energy storage cell 110, depending on that cell's measured storage capacity. For example, each cell controller 101 can be operated so that each cell 110 will follow as closely as possible a target slope (e.g., desired behavior).

FIG. 5 illustrates a target capacity fade versus cycle number performance function of an energy storage cell, according to one embodiment. Line 500 illustrates capacity fade versus number of cycles for a given load, and may be based upon performance testing of actual cells or simulated predictions. For any given cell, the target charge capacity fade slope could be different from the discharge capacity fade slope. For simplicity, FIG. 5 illustrates a notional slope that could be applied to either charge or discharge.

Alternatively, another exemplary target system management goal could be to maximize the lifetime energy contribution of each cell in the system—a goal that does not necessarily imply that the cells decay at the same rate.

In one embodiment, the multi-cell system management controller module 204 also sets the charge currents consistently with the bus-side string current and such that the aggregate bus-side voltage of the series string of cell controllers 101 is fixed.

In one embodiment, in the event that a cell model module 203 determines that a cell is not capable of contributing useful energy to the series string and/or absorbing charge, or that the cell is entering the precursor stages of an unsafe operating regime, such as thermal runaway, multi-cell system management controller module 204 then instructs operating system 205 to set the corresponding cell controller 101 such that the cell is electrically bypassed. In this manner, the series string continues to function with the energy contributions of the remainder of cells in the string, while the system mitigates potential harm to the bypassed cell by preventing any further charging or discharging of the cell. In such a condition, the processing and control system 200 re-adjusts the load and/or charge of the remaining cells to compensate, such that the bus-side string voltage remains fixed and the system adheres to a target system management goal, as described above.

Processor 201 then instructs operating system 205 to measure and record energy storage cell data (304). In one embodiment, in conjunction with cell controller modules 101, operating system 205 measures current, voltage, and temperature for each energy storage cell in the system. Operating system 205 stores these measured data in memory and database module 202.

In one embodiment, based on the new measurements, cell model modules 203 then estimate the actual state of charge of each energy storage cell in the system, and store these new estimates in memory and database module 202 (305).

Processor 201 then compares these estimates of actual state of charge to the most-recent predicted estimates of state of charge for each energy storage cell in the system (306).

Where differences exist between actual and predicted state-of-charge estimates, processor 201 invokes the cell model modules 203 to make modifications to the cell model algorithms (307).

Following step 307, the process then returns to step 301 periodically and continuously. In this iterative manner, the energy storage pack 150 continually predicts the performance and behavior of each energy storage cell 110, and then measures actual performance and behavior. When the system 150 detects differences between predicted and actual performance and behavior, the system 150 refines the predictive algorithms to narrow the differences. Through this iterative process, the system 150 is able to predict and manage system performance with ever-increasing accuracy.

According to one embodiment, the processing of processing and control system 200 is carried out by one or more processors executing sequences of software processing instructions and by suitably communicating with one or more memory or storage devices in any suitable database (e.g., local or remote database). Processing instructions, and look-up tables, are accessed from any suitable computer-readable storage medium, such as a memory card, flash memory, magnetic or optical disc, CD or DVD, or any other memory chip or cartridge. In alternative embodiments, hard-wired circuitry is used in place of or in combination with software instructions to implement the exemplary methods described herein. Thus, embodiments of the invention are not limited to any specific combination of hardware circuitry and software. It should be appreciated that the processing disclosed herein can be carried out using any suitable processing system, such as one or more conventional processors located in one computer system or in multiple computer systems acting together by any suitable communication link.

According to one embodiment, multiple such series strings can be connected in parallel to provide a multi-cell storage pack with even larger power handling and energy capacity.

FIG. 4 illustrates an exemplary block diagram of a multi-cell energy storage system with multiple series strings of cell control circuits placed in parallel, according to one embodiment. As shown in FIG. 4, in such a parallel combination of series strings, the series strings are made up of the same building blocks as in FIG. 1, with each cell controller 101 connected to an energy storage cell 110, and with the cell controllers themselves connected in a series string. As shown in FIG. 4, multiple such series strings of cell controllers can in turn be connected in parallel. Note that in such a configuration, the series strings may be of differing lengths; in other words, each series string of cell controllers 101 could consist of a different number of cell controllers 101. Moreover, each series string could include energy storage cells with different properties, such as differing electrochemistry, voltage characteristics, and/or energy storage capacity.

Each cell controller 101 is connected to processing and control module 102, which provides supervisory control of the cell controller 101. The processing and control module 102 measures, and stores in a database, current, temperature, and voltage data taken from each cell controller 101, correlates those data with operating conditions predicted by a software model included in control module 102, and processes charge and discharge instructions to be sent to the cell controllers 101.

A central processing system communicates with and controls the plurality of electrical modules. Each module includes an electrical converter circuit for controlling a corresponding energy storage cell by transforming an input voltage from the cell to a desired output voltage or by transforming an input current from the cell to a desired output current. Each module also includes a sensing system for sensing electrical characteristics of an energy storage cell connectable to the electrical converter circuit. A processing system controls the electrical converter circuits using information from the sensing system. Embedded in the processing system is a methodology for iteratively predicting the performance of each energy storage device in the system, measuring actual performance, comparing predicted and actual performance, and refining the predictive algorithms to narrow the differences. Through this iterative process, the present systems and methods enhance overall energy storage pack performance.

Systems and methods for intelligent, adaptive management of energy storage packs have been disclosed. The embodiments described herein are for the purpose of elucidation and should not be considered limiting the subject matter of the disclosure. Various modifications, uses, substitutions, combinations, improvements, methods of production without departing from the scope or spirit of the present invention would be evident to a person skilled in the art.

The invention claimed is:

1. A method, comprising:
   determining respective dynamic performance capabilities of a plurality of energy storage cells of a common block of energy storage cells, each dynamic performance capability representing at least one of energy storage capacity, state of charge, decay rate, remaining lifetime, and safety of a respective one of the plurality of energy storage cells;
   using the dynamic performance capabilities of the plurality of energy storage cells, determining respective optimal power flows of the plurality of energy storage cells which maximize lifetime energy contributions of the plurality of energy storage cells; and
   individually controlling power flow through the plurality of energy storage cells according to the respective optimal power flows of the plurality of energy storage cells, using a respective converter circuit connected to each of the plurality of energy storage cells, to maximize lifetime energy contributions of the plurality of energy storage cells.

2. The method of claim 1, further comprising predicting performance capabilities of a first energy storage cell of the plurality of energy storage cells, and predicting remaining life of the first energy storage cell, while the first energy storage cell operates in the common block of energy storage cells.

3. The method of claim 1, further comprising operating the respective converter circuit of each of the plurality of energy storage cells according to a load policy.

4. The method of claim 3, wherein the load policy includes (a) determining if a load placed on a first energy storage cell of the plurality of energy storage cells reflects a predicted performance capability and lifetime of the first energy storage cell, and (b) determining if a load placed on a second energy storage cell of the plurality of energy storage cells reflects a predicted performance capability and lifetime of the second energy storage cell.

5. The method of claim 3, wherein the load policy includes (a) determining if a first energy storage cell of the plurality of energy storage cells meets a maximum lifetime performance rating of the first energy storage cell and (b) determining if a second energy storage cell of the plurality of energy storage cells meets a maximum lifetime performance rating of the second energy storage cell.

6. The method of claim 2, further comprising determining differences in predicted and actual performance of the first energy storage cell, and utilizing the differences when predicting the first energy storage cell's energy storage capacity, performance capabilities, and remaining life.

7. The method of claim 2, further comprising controlling a temperature of the first energy storage cell by adjusting a load applied to the first energy storage cell.

8. The method of claim 1, further comprising determining an anomalous cell behavior of a first energy storage cell of the plurality of energy storage cells, wherein the anomalous cell behavior includes thermal runaway.

9. The method of claim 8, further comprising electrically disconnecting the first energy storage cell from an output electrical bus of the common block of energy storage cells.

10. The method of claim 9, further comprising compensating for the first energy storage cell that is electrically disconnected by distributing a load across the plurality of energy storage cells, of the common block of energy storage cells, not including the first energy storage cell.

11. The method of claim 10, further comprising distributing the load according to a predicted performance and remaining lifetime of each cell of the plurality of energy storage cells not including the first energy storage cell.

12. The method of claim 1, further comprising storing a first current measurement of a first energy storage cell of the plurality of energy storage cells, as well as current measurements of other energy storage cells of the plurality of energy storage cells.

13. The method of claim 12, further comprising storing a first voltage measurement of the first energy storage cell, as well as voltage measurements of other energy storage cells of the plurality of energy storage cells.

14. The method of claim 13, further comprising storing a first temperature measurement of the first energy storage cell, as well as temperature measurements of other energy storage cells of the plurality of energy storage cells.

15. The method of claim 1, wherein the respective converter circuit of a first energy storage cell of the plurality of energy storage cells isolates the first energy storage cell from other energy storage cells of the plurality of energy storage cells.

16. The method of claim 15, wherein outputs of the respective converter circuits of the plurality of energy storage cells are stacked in a series connection.

17. The method of claim 4, further comprising operating the respective converter circuit of the first energy storage cell to change the load placed on the first energy storage cell so that the load reflects the predetermined performance capability and lifetime of the first energy storage cell.

18. The method of claim 6, further comprising refining a model of the first energy storage cell based at least in part on the differences in predicted and actual performance of the first energy storage cell.

19. The method of claim 1, further comprising:
continuously varying magnitude of power transferred between a first energy storage cell of the plurality of energy storage cells and a load, independently of operation of a second energy storage cell of the plurality of energy storage cells;
wherein the load is selected from the group consisting of an energy source and an energy sink.

20. The method of claim 1, further comprising:
controlling current through a first energy storage cell of the plurality of energy storage cells during charging of the first energy storage cell, such that the first energy storage cell is charged according to a desired power absorption of the first energy storage cell; and
controlling current through a second energy storage cell of the plurality of energy storage cells during charging of the second energy storage cell, such that the second energy storage cell is charged according to a desired power absorption of the second energy storage cell, the desired power absorption of the second energy cell being different from the desired power absorption of the first energy storage cell.

21. The method according to claim 1, further comprising:
transforming a respective voltage across each of the plurality of energy storage cells to a desired respective bus contribution voltage that is different from the voltage across the energy storage cell; and
summing the bus contribution voltages to yield a string voltage.

* * * * *